United States Patent [19]

Mouri et al.

[11] Patent Number: 5,187,041
[45] Date of Patent: Feb. 16, 1993

[54] IMAGE FORMING METHOD AND IMAGE FORMING APPARATUS

[75] Inventors: Akihiro Mouri, Kokubunji; Kazuo Isaka, Tokyo; Tetsuro Fukui, Kawasaki; Masato Katayama, Yokohama, all of Japan

[73] Assignee: Canon Kabushiki Kaisha, Tokyo, Japan

[21] Appl. No.: 679,903

[22] Filed: Apr. 3, 1991

[30] Foreign Application Priority Data

Apr. 4, 1990 [JP] Japan ................. 2-088168

[51] Int. Cl.[5] .............................................. G03C 5/54
[52] U.S. Cl. ..................................... 430/201; 430/202; 430/203; 430/952
[58] Field of Search ................ 430/201, 202, 203, 952

[56] References Cited

U.S. PATENT DOCUMENTS

| | | | |
|---|---|---|---|
| 3,245,796 | 4/1966 | Burg | 430/201 |
| 4,021,240 | 5/1977 | Cerquone et al. | 96/29 D |
| 4,123,274 | 10/1978 | Knight et al. | 96/66 T |
| 4,220,709 | 9/1980 | De Mauriac | 430/353 |
| 4,587,198 | 5/1986 | Fisch | 430/201 |
| 4,629,676 | 12/1986 | Hagakawa et al. | 430/203 |
| 4,649,098 | 3/1987 | Takeda | 430/207 |
| 5,001,032 | 3/1991 | Katayama et al. | 203/203 |
| 5,004,667 | 4/1991 | Arahara et al. | 430/255 |
| 5,021,321 | 6/1991 | Fukui et al. | 430/201 |
| 5,122,433 | 6/1992 | Kawaguchi | 430/203 |

FOREIGN PATENT DOCUMENTS

| | | |
|---|---|---|
| 243159 | 10/1987 | European Pat. Off. |
| 44-30270 | 6/1969 | Japan |
| 45-18416 | 6/1970 | Japan |
| 52-70836 | 6/1977 | Japan |
| 56-27132 | 3/1981 | Japan |
| 58-115638 | 7/1983 | Japan |
| 58-118639 | 7/1983 | Japan |
| 59-53831 | 3/1984 | Japan |
| 59-55429 | 3/1984 | Japan |
| 1-205626 | 8/1989 | Japan |

OTHER PUBLICATIONS

L. J. Fleckenstein, "Color Forming Agents", The Theory of the Photographic Process, 4th Ed., Macmillan Publishing, pp. 353–361.

Primary Examiner—Richard L. Schilling
Attorney, Agent, or Firm—Fitzpatrick, Cella, Harper & Scinto

[57] ABSTRACT

An image is formed by securing an image receiving medium onto a support member, superposing onto the image receiving medium an image forming medium containing at least a photosensitive silver halide, an organic silver salt, a reducing agent, a polymerizable polymer precursor and a photopolymerization initiator, subjecting the image forming medium to imagewise exposure, heating the image forming medium thus treated, subjecting it to polymerization exposure to form a polymer image, and transferring a heat-diffusible coloring matter to the image receiving medium, corresponding with said polymer image.

5 Claims, 3 Drawing Sheets

IMAGE FORMING METHOD AND IMAGE FORMING APPARATUS

BACKGROUND OF THE INVENTION

1. The present invention relates to an image forming method that forms an image by dry-processing an image forming medium containing a silver halide, and an image forming apparatus that carried out such an image forming method.

2. Related Background Art

Energies used to form or record an image include light, sound, electricity, magnetism, heat, radiations such as electrons rays and X-rays, and chemical energy, among which, in particular, widely used are light, electricity, heat energy, or a combination of any of these.

For examples, the image forming method that employs the combination of light energy with chemical energy includes a silver salt photographic process and a method in which a diazo copying paper is used. The method that employs the combination of light energy with electric energy includes an electrophotographic system. The method that utilizes heat energy also includes a method in which a thermal recording paper or transfer recording paper is used. On the other hand, known as the method that utilizes electric energy is a method in which an electrostatic recording paper, electrothermal recording paper, or electrosensitive recording paper is used.

Of the above image forming methods, the silver salt photographic process can obtain an image having a high resolution. The silver salt photographic process, however, requires the developing and fixing that uses complicated liquid compositions, or the drying of an image (or a print).

Now, development is energetically made on image forming methods that can form can image through a simple processing.

For example, U.S. Pat. No. 4,629,676 teaches a method in which polymerization reaction under dry (thermal) conditions is caused by the photosensitive reaction of silver halide that acts as a trigger, to form an image comprising a polymer.

This method has the advantage that any complicated wet processing is not required, but has had the disadvantage that the polymer formation rate (i.e, polymerization rate of a polymeric compound) is so low that it takes a long time to form the polymer image. Incidentally, this disadvantage arises presumably because of a reaction intermediate (which functions as a polymerization initiator) formed in the course of heating, by the reaction between silver produced from silver halide by imagewise exposure and a reducing agent, which intermediate is so stable and has so low activity as the polymerization initiator that the polymerization reaction can not proceed so rapidly.

On the other hand, to cope with this problem to accelerate the polymerization, Japanese Patent Application Laid-open No. 52-70836 discloses a method in which a thermal polymerization initiator is used.

This method comprises forming a latent image comprising silver metal produced from silver halide by imagewise exposure, converting, under heating, a reducing agent into an oxidized product having a polymerization inhibitory powder different from that of said reducing agent by utilizing a catalytic action of the above silver metal, thereby producing a difference in the polymerization inhibitory power between the reducing agent and the resulting oxidized product and also causing a thermal polymerization reaction utilizing the thermal polymerization initiator, thus forming a polymer image corresponding with the difference in the polymerization inhibitory power.

This method, however, has been involved in the disadvantage that a good contrast can be made with difficulty in the polymer image.

This disadvantage arises presumably because the oxidation-reduction reaction taking place in a latent image portion to form the oxidized product and the polymerization reaction to form the polymer image are allowed to take place in the same heating step, so that these reactions may proceed in a competitive fashion and thus the respective reactions may not proceed in a good efficiency.

The image formation according to this method is very unstable in that, for example, the areas on which the polymer is formed may turn into exposed areas or unexposed areas only because of a slight change in the amount of the reducing agent.

In addition, U.S. Pat. No. 4,649,098 discloses a method in which a reducing agent having a polymerization inhibitory power is brought into an oxidized product by imagewise consumption (at imagewise exposed areas) in the course of the developing of silver halide, and, after imagewise inhibition (at imagewise unexposed areas) of polymerization reaction by the action of the residual reducing agent, light energy is uniformly applied (whole areal exposure) from the outside to cause photopolymerization at the area at which the reducing agent has been consumed (imagewise exposed area), thus forming a polymer image.

Our research group has proposed a method in which an image comprised of a coloring matter is formed on an image receiving paper by utilizing a difference in the rate of evaporation of coloring matters between a polymerized area and an unpolymerized area (Japanese Patent Application No. 1-205626, corresponding to U.S. patent application Ser. No. 564,060, now U.S. Pat. No. 5,021,321).

When a multi-color image is formed utilizing the difference in the rate of evaporation of coloring matters between a polymerized area and an unpolymerized area, plural images with different colors must be formed superposingly on the same sheet of image receiving paper. It, however, has been technically very difficult to superpose plural images with different colors in a doubling-free, or misregistration-free state.

SUMMARY OF THE INVENTION

An object of the present invention is to provide an image forming method that can superpose plural images with different colors in a doubling-free state when the images are formed superposingly on the same image receiving medium, and an image forming apparatus for carrying out such an image forming method.

The image forming method of the present invention comprises the steps of;
(a) securing an image receiving medium on to a support member;
(b) superposing onto said image receiving medium an image forming medium containing at least a photosensitive silver halide, an organic silver salt, a reducing agent, a polymerizable polymer precursor and a photopolymerization initiator, and in that state subjecting said image forming medium to imagewise exposure;

(c) heating the image forming medium having been subjected to the step (b);

(d) subjecting the image forming medium having been subjected to the step (c), to poylmerization exposure to form a polymer image in the image forming medium; and (e) transferring a heat-diffusible coloring matter to said image receiving medium, corresponding with said polymer image.

The image forming apparatus of the present invention comprises;

a support member which is cylindrical and on the periphery of which an image receiving medium is secured;

a first exposure means for exposing an image forming medium in the state that the image forming medium is superposed on said image receiving medium;

a first heating means for heating the image forming medium having been exposed;

a second exposure means for exposing the image forming medium having been heated by the first heating means; and a second heating means for transferring to said image receiving medium a heat-diffusible coloring matter contained in said image forming medium or in a color transfer recording medium;

said first exposure means, said first heating means, said second exposure means and said second heating means being disposed around said support member.

DESCRIPTION OF THE PREFERRED EMBODIMENTS

Preferred embodiments of the present invention will be described below with reference to the accompanying drawings.

Figure 1A:
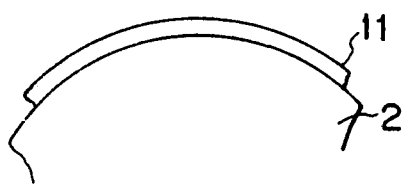
FIGS. 1A to 1E partially illustrate for each step an example of a process in the image forming method of the present invention.

In the image forming method of the present invention, a color image is formed by a process comprising the following steps:

(a) As shown in FIG. 1A, an image receiving medium 11 such as paper is secured at a given position on a cylindrical support member 2. The support member 2 is rotatably provided around a rotating shaft 2a (see FIG. 3). The image receiving medium 11 is provided on the periphery of the support member 2.

Figure 1D:
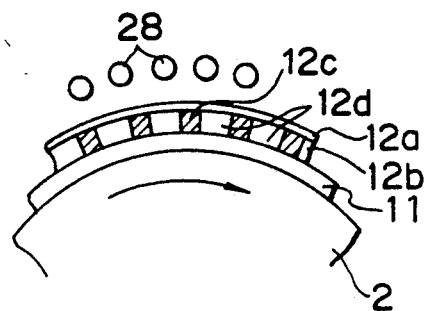
Figure 1B:
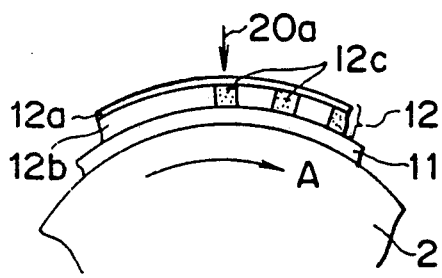

(b) Next, as shown in FIG. 1B, an image forming medium 12 is superposed on the image receiving medium 11, in the state of which an image forming layer 12b is subjected to imagewise exposure. The image forming medium 12 comprises at least the image forming layer 12b, provided on a base film 12a. The image forming layer 12b contains a photosensitive silver halide, an organic silver salt, a reducing agent, a polymerizable polymer precursor and a photopolymerization initiator. In the image forming medium 12, the organic silver salt and reducing agent contained in the image forming layer 12b undergo oxidation-reduction reaction as a result of subjecting the image forming layer 12b to exposure and heating (heat development), and the oxidized product produced as a result of the reaction serves as a light-absorbing compound. Alternatively, the oxidized product produced as a result of the reaction between the organic silver salt and reducing agent further reacts with a coupler to produce the light-absorbing compound.

The imagewise exposure is carried out using, for example, a laser beam 20a that scans corresponding with image signals, while the support member 2 is rotated in the direction of an arrow A. As a result of the imagewise exposure, silver metal is produced from the photosensitive silver halide present in an exposed area 12c, and this forms a latent image. The silver metal serves as a catalyst of the thermal reaction between the organic silver salt and reducing agent.

As conditions for the exposure to light in carrying out the writing of this latent image, conditions under which the resulting polymer image can obtain the desired performance such as sufficient contrast may be used by appropriately selecting them depending on the concentration, type and so forth of the silver halide incorporated into the image forming medium.

The image forming method of the present invention, which employs the photosensitive silver halide in the step of this imagewise exposure, enables highly sensitive writing.

The base film 12a of the image forming medium 12 need not be used so long as the layer itself is strong enough to be kept in the layer form.

In place of the base film 12a, a protective layer comprised of polyvinyl alcohol or polyethylene terephthalate may be provided at the position of the base film 12a so that the polymerization reaction can be prevented from its inhibition due to oxygen and any damages ascribable to an external force can be prevented.

Figure 2A:
FIGS. 2A to 2E partially illustrate for each step another example of a process in the image forming method of the present invention.
Figure 2B:
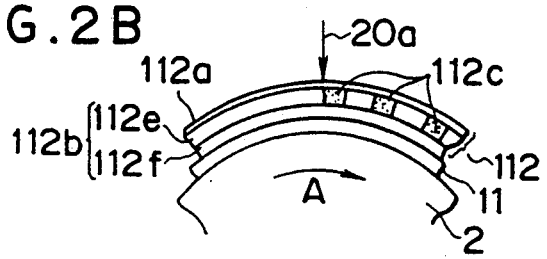
Figure 2C:
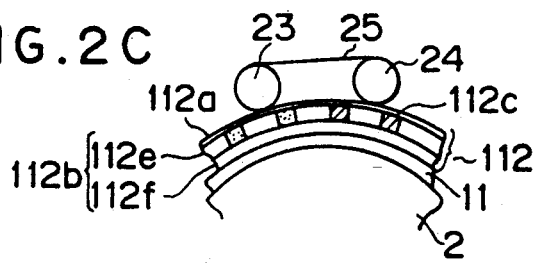

(c) Next, the image forming medium 12 in which the latent image has been formed is heated (i.e., thermally developed) as shown in FIG. 2C. As a result of heating the image forming layer 12b, the silver metal selectively acts as a catalyst in the exposed area 12c, where the organic silver salt reacts with the reducing agent. The organic silver salt is reduced to a silver atom (metallic silver) and at the same time the reducing agent is oxidized to form an oxidized product. This oxidized product has light absorption. In another instance, the oxidized product further reacts with a coupler to produce an organic compound that exhibits light absorption.

Figure 1E:
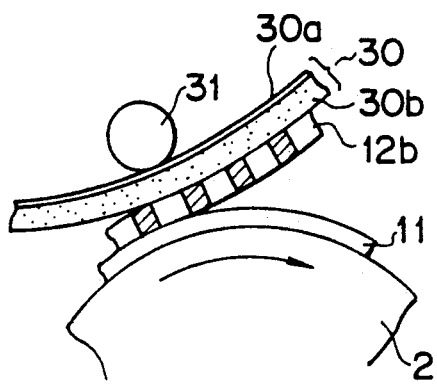
Figure 1C:
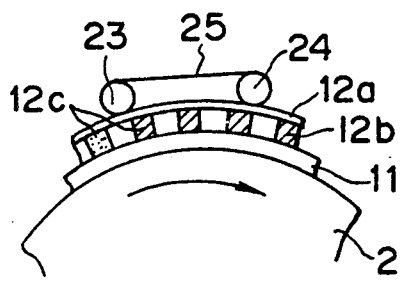

In the step as shown in FIG. 1C, the heating is carried out using rollers 23 and 24 each having a halogen heater element, and a belt 25 that rotates around the rollers 23 and 24. Alternatively, it is also possible to utilize, for example, a method in which a hot plate, a heat roll, a thermal head or the like is used, or a method in which heating is carried out by electrification, irradiation with laser beams, irradiation with microwaves or irradiation with infrared rays.

The heating in this heating step is carried out under appropriate selection of conditions necessary for the progress of oxidation-reduction reaction and the formation of the light-absorbing organic compound. The heating temperature depends on the composition of mediums and can not be sweepingly defined. The heating may preferably be carried out at a temperature of from 60° C. to 200° C., and more preferably from 70° C.

to 150° C., for 1 second to 5 minutes, and more preferably for 3 seconds to 60 seconds. In general, high temperatures can complete the heating in a short time and low temperatures may require the heating to be carried out for a long time.

(d) Subsequently, as shown in FIG. 1D, the image forming layer 12b is subjected to polymerization exposure. As a result of the polymerization exposure on the whole surface of the image forming layer 12b, the polymerizable polymer precursor is polymerized in an imagewise unexposed area 12d by the action of the photopolymerization initiator. On the other hand, the light-absorbing organic compound is present at the imagewise exposed area 12c, and therefore the light with wavelengths for the polymerization exposure is absorbed into that area, so that no polymerization proceeds there, compared with the imagewise unexposed area 12d. Hence, a difference in the state of polymer formation occurs between the imagewise exposed area 12c and the imagewise unexposed area 12d, so that a polymer image is formed in the imagewise unexposed area 12d.

In the step of (d), the light used in subjecting the image forming layer 12c to the whole areal exposure is the light with wavelengths to which the photopolymerization initiator (in the present invention, photopolymerization initiator is defined to include a sensitizer) has a sensitivity and also which the light-absorbing organic compound can absorb (i.e., light with effective wavelengths).

However, light with wavelengths other than the light with effective wavelengths may also be used in combination within the purport that the desired polymer image can be obtained. In instances in which the wavelength regions must be limited, the exposure may be carried out using, for example, a cut filter.

In the step as shown in FIG. 1D, the polymerization exposure is carried out using a plurality of ultraviolet fluorescent lamps 28.

(e) A color transfer recording medium 30 is superposed on the image forming layer 12b in which the polymer image has been formed, and then heating is carried out (FIG. 3E). The color transfer recording medium 30 comprises a base film 30a and provided thereon a coloring material layer 30b containing a heat-diffusible coloring matter. As a result of the heating in the state that the color transfer recording medium 30 has been superposed on the image forming layer 12b, the heat-diffusible coloring matter is diffusion-transferred to the image receiving medium 11, corresponding with the polymer image, so that an image comprised of the heat-diffusible coloring matter is formed on the image receiving medium. The image forming layer 12b comes to adhere to the coloring material layer 30b as a result of the heating, and then peeled from the image receiving medium 11 together with the color transfer recording medium 30.

The amount of transfer of the heat-diffusible coloring matter can be controlled corresponding with the degree of polymerization of the image forming layer 12b (the amount of transfer of the heat-diffusible coloring matter decreases with an increase in the degree of polymerization), and hence it is possible to readily form on the image receiving medium an image having a density gradation.

The mechanism by which the diffusibility of the heat-diffusible coloring matter in the polymerized area is that the molecular chain of the polymer can be loosened with difficulty even when the polymerized area is heated, as a result of the polymerization of the polymerizable polymer precursor or, when a polyfunctional polymerizable polymer precursor is contained, as a result of the crosslinking thereof, and thus the heat-diffusible coloring matter is suppressed from being diffused.

In the case when the base film 12a or the protective layer is provided in the image forming medium 12, the base film 12a or the protective layer is removed after completion of the above step (d) and before the color transfer recording medium 30 is superposed on the image forming layer 12b.

With regard to the temperature for the heating in the step (e), its optimum value may vary depending on various conditions such as the king of the heat-diffusible coloring matter and the degree of polymerization of the polymer. It may be in the range of from 80° C. to 250° C., and preferably from 80° C. to 200° C. In the step as shown in FIG. 1E, the heating is carried out using a heat roller 31. As heating means, it is possible to use the same heating means as described in relation to the step (c) (the step of heat development).

A monochromatic image is thus formed on the image receiving medium.

In the case when a multi-color image is formed, the above steps (b) to (e) are repeated further after completion of the step (e) except that the color transfer recording medium used in the step (e) is replaced with a color transfer recording medium containing a heat-diffusible coloring matter with a different color. The steps from step (b) to step (e) may be thus repeated in the number of times corresponding tot he number of the addition desired colors so that images with the respective colors are superposed on the same image receiving medium 11. Thus a multi-color image can be formed. For example, in an instance in which images with colors of yellow, magenta, cyan and black are superposed on the same image receiving medium 11 to form a multi-color image, the image formation according to the steps from step (b) to step (e) may be carried out four times.

As light sources used in the imagewise exposure and the polymerization exposure, usable are, for example, sunlight, tungsten lamps, mercury lamps, halogen lamps, xenon lamps, fluorescent lamps, LEDs, and lasers, and the wavelength of the light used in these steps may be the same or different. Even if the light having the same wavelength is used, the latent image can be sufficiently written with use of light having an intensity of the level that may not cause photopolymerization in the step of imagewise exposure, since the silver halide usually has a sufficiently higher photosensitivity than the photopolymerization initiator. For example, in the step of imagewise exposure, the exposure may be carried out using light that may give about 1 mJ/cm$^2$ or less at the surface of the image forming medium. In the step of polymerization exposure, the exposure may be carried out using light that may give about 500 mJ/cm$^2$ or less at the surface of the image forming medium.

The image forming layer 12b may be of multilayer structure. For example, as shown in FIG. 2B, the image forming layer 12b may be constituted of a photosensitive layer 112e and a polymerizing layer 112f, and formed on the support 112a. In this instance, the photosensitive layer 112e contains at least the photosensitive silver halide, organic silver salt and reducing agent, and the polymerizing layer 112f contains at least the polymerizable polymer precursor and photopolymerization initiator.

In instances in which an image is formed using the image forming medium comprised of the image forming layer of multi-layer structure, the image is formed according to the same image forming method as described in relation to FIG. 1. First, as shown in FIG. 2A, in the step (a) an image receiving medium 11 is secured to a support member 2. Next, as shown in FIG. 2B, in the step (b) the photosensitive layer 112e is imagewise exposed to light in the desired form. As a result, silver metal is produced on the photosensitive silver halide in an exposed area 112c. This forms a latent image. The silver metal produced serves as a catalyst for the thermal reaction between the organic silver salt and reducing agent contained in the photosensitive layer 112e.

Next, as shown in FIG. 2C, in the step (c) the photosensitive layer 112e in which the latent image has been formed is heated. As a result, the silver metal selectively acts as a catalyst at the exposed area 112c, and the organic silver salt reacts with the reducing agent, where the organic silver salt is reduced to a silver atom and at the same time the reducing agent is formed into an oxidized product.

Heating conditions in this step of heat development are the same as the instance described in relation to FIG. 1.

Figure 2D:
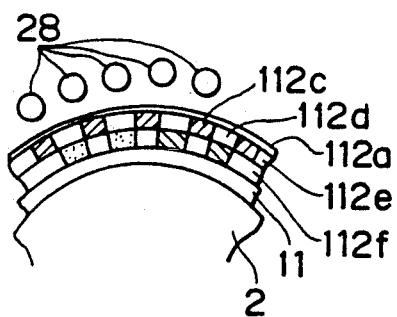

Subsequently, as shown in FIG. 2D, in the step (d), polymerization exposure is carried out on the whole surface from the photosensitive layer 112e side to bring the photopolymerization initiator contained in the polymerizing layer 112f into cleavage to generate a radical species. This radical species causes polymerization reaction, and thus a polymer area is formed in the polymerizing layer 112f. On that occasion, the amount of transmission of the light of the wavelength region which the photopolymerization initiator absorbs is different between the exposed area 112c and unexposed area 112d, and hence a difference is produced in the state of formation of polymers, between the part corresponding to the unexposed area 112c and the part corresponding to the unexposed area 112d, of the polymerization at the part corresponding to the unexposed area 112d than the part corresponding to the exposed area 112c). A polymer image is thus formed because of this difference.

Figure 2E:
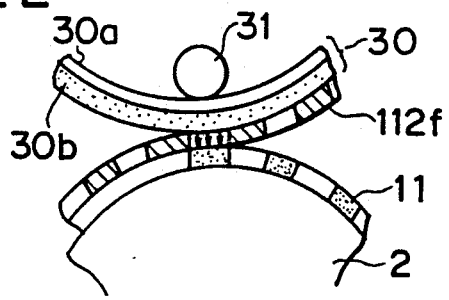

As a final step, as shown in FIG. 2E, a color transfer recording medium 30 containing a heat-diffusible coloring matter is superposed on the image forming layer 112b, followed by heating, so that the heat-diffusible coloring matter is transferred to the image receiving medium 11, corresponding with the polymer image. The image forming layer 112b comes to adhere to the color transfer recording medium 30 as a result of the heating, and then peeled from the image receiving medium 11 together with the color transfer recording medium 30. The above steps (b) to (e) are repeated further in the number of times corresponding to the number of the additional desired colors. Thus a multicolor image can be formed on the image receiving medium 11.

In the method shown in FIGS. 2A to 2E, after completion of the step (d), the photosensitive layer 112e and the base film 112a are peeled from the polymerizing layer 112f, and then, as shown in FIG. 2E, in the step (e) the color transfer recording medium 30 is superposed on the polymerizing layer 112f. It, however, is also possible to carry out the transfer of the heat-diffusible coloring matter in the state the photosensitive layer 112e remains as it is.

As shown in FIG. 2E, the polymerizing layer 112f, to which the heat-diffusible coloring matter has been transferred, is peeled from the image receiving medium 11 together with the color transfer recording medium 30.

Figure 3:
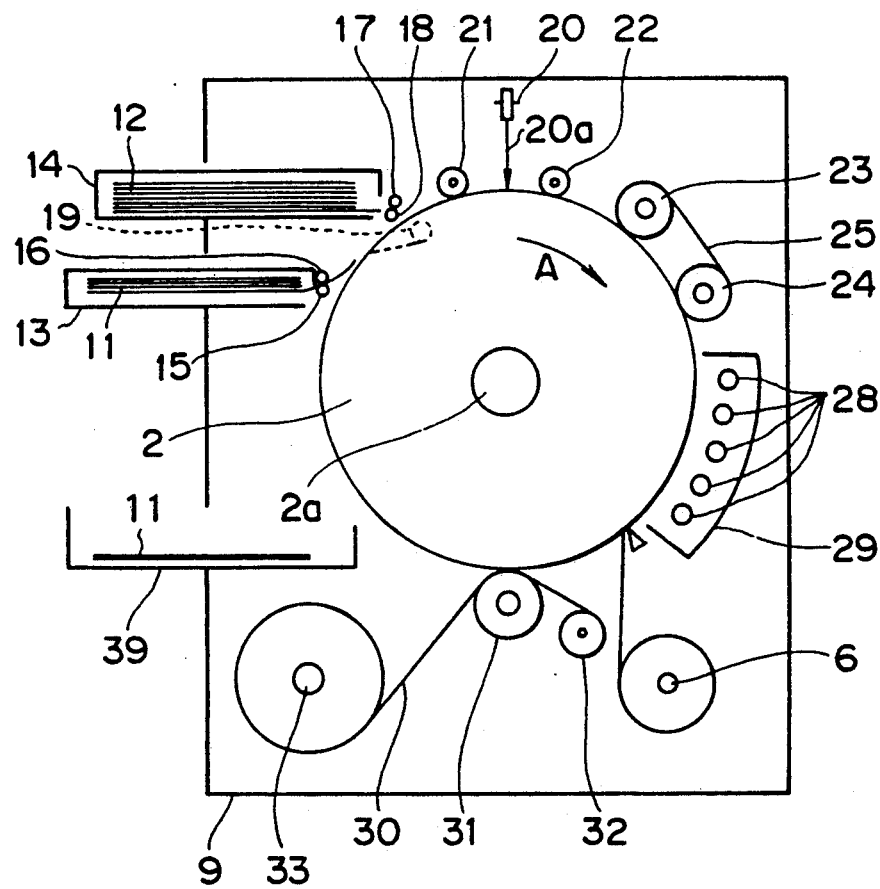
FIG. 3 is a schematic side elevation to shown an example of the image forming apparatus of the present invention.

The image forming apparatus that carried out the color image forming method of the present invention comprises, as shown in FIG. 3, an outer case 9, in the interior of which the cylindrical support member 2 is rotatably provided around the rotating shaft 2a.

A feed zone of this apparatus is detachably provided with a cartridge 14 in which the image forming medium 12 or 112 is contained and a cartridge 13 in which the image receiving medium 11 such as paper is contained.

The image receiving medium 11 fed from the cartridge 13 by means of rollers 15 and 16 is chucked with a clip 19 provided on the periphery of the support member 2 and secured at a given position on the periphery of the support member 2 as the support member 2 is rotated in the direction of the arrow A. On the other hand, the image forming medium 12 fed from the cartridge 14 by means of rollers 17 and 18 is superposed on the image receiving medium 11 and delivered to an imagewise exposure zone as the support member 2 is rotated. The clip 19 is provided in a recess made in the peripheral wall of the support member 2.

At the imagewise exposure zone, the image forming medium 12 on the image receiving medium 11 is imagewise exposed by means of a first exposure means 20 such as a laser. The exposure means 20 is scanned according to image signals. Supporting rollers 21 and 22 brings the image receiving medium 11 and the image forming medium 12 into close contact with the periphery of the support member 2.

The image forming medium 12 having been imagewise exposed is forwarded to a heat development zone as the support member 2 is rotated and headed with heating rollers 23 and 24 and a belt 25 that constitute a first heating means.

The image forming medium 12 thus developed is forwarded to a polymerization exposure room as the support member 2 is rotated. The polymerization exposure zone is provided with light sources 28 comprised of ultraviolet fluorescent lamps and a light-source guide 29 that constitute a second exposure means, where the image forming layer 12b is exposed to ultraviolet light to form an unpolymerized area and a polymerized area in the image forming layer 12b.

The image receiving medium 11 and image forming medium 12, having been processed at the polymerization exposure zone, are then delivered to a transfer zone as the support member 2 is rotated. On the way from the polymerization exposure zone to the transfer zone, members that may obstacle the transfer of the heat-diffusible coloring matter are removed from the image forming medium. More specifically, the base film 12a (FIG. 1) or the base film 112a (FIG. 2), or in some instances both the base 112a and the photosensitive layer 112e or the protective layer is/are wound up around a wind-up roller 6.

At the transfer zone, the image forming layer 12b is superposed on the color transfer recording medium 30 fed from a roller 32. The color transfer recording medium 30 is heated with a heating roller 31 that serves as a second heating means, so that the heat-diffusible coloring matter in the color transfer recording medium 30 is transferred to the image receiving medium 11 and thus an image is formed on the image receiving medium 11. Subsequently, the image forming layer 12b and the color transfer recording medium 30 are peeled from the image receiving medium 11 and wound up around a wing-up roller 33.

The image receiving medium 11 on which an image has been formed at the transfer zone is delivered to an output zone as the support member 2 is rotated and thus outputted to an image receiving medium output tray 39 as a result of the release of the clip 19 of the support member 2.

In the case when images with other colors are further superposingly formed on the image receiving medium 11 on which an image has been formed at the transfer zone, the image receiving medium 11 with the image is delivered, without its output at the output zone, to the feed zone as the support member 2 is rotated. On the image receiving medium 11 delivered to the feed zone, a fresh image forming medium is again superposed here, and then successively delivered to the imagewise exposure zone, heat development zone, polymerization exposure zone and transfer zone, so that an image is again formed. At the transfer zone, another color transfer recording medium 30 is used which has a color different from that of the color transfer recording medium 30 previously used. For this purpose, the color transfer recording medium 30 may preferably be a color transfer recording medium 30 in which an image forming layer containing heat-diffusible coloring matters with different colors (e.g., yellow, magenta, cyan and also black) separately in regions for each color is formed on the same base film. Use of such a color transfer recording medium makes it possible to successively transfer heat-diffusible coloring matters from the regions having the desired colors and superpose images having different colors, thereby forming a multi-color image.

The transport through the feed zone, imagewise exposure zone, heat development zone, polymerization exposure zone and transfer zone is repeated in this way, so that a multi-color image can be formed on the image receiving medium 11, and the resulting image receiving medium 11 finally outputted to the output tray 39.

In FIGS. 1 and 2, those cut to given sizes are shown as the image forming medium and the image receiving medium. However, an image forming medium or image receiving medium with a continuous length, having been not cut to a given size, may also be used in the form of a rolled sheet.

In another embodiment, the heat-diffusible coloring matter may be contained in the image forming layer 21b or the polymerizing layer 112f so that the heat-diffusible coloring matter can be transferred to the image receiving medium by heating the image forming medium in the step (e), without use of the color transfer recording medium 30. In this instance, the heat-diffusible coloring matter may be contained in the image forming layer 12b preferably in an amount of from 5 parts by weight to 200 parts by weight, and more preferably from 10 parts by weight to 100 parts by weight, based on 100 parts by weight of the silver halide, organic silver salt, reducing agent, polymerizable polymer precursor, photopolymerization initiator and optional binding in total.

In the instance where the heat-diffusible coloring matter is contained in the polymerizing layer 112f, the heat-diffusible coloring matter may suitably be contained in the polymerizing layer 112f in an amount of from 5 parts by weight to 60 parts by weight.

Examples of the image forming medium that can be used in the image forming method of the present invention will be described below in detail.

The image forming medium used in the present invention contains at least i) a photosensitive silver halide, an organic silver salt and a reducing agent that react each other to produce a light-absorbing compound as a result of imagewise exposure and heating, ii) a polymerizable polymer precursor, and iii) a photopolymerization initiator; said light-absorbing compound being capable of absorbing light with wavelengths to which said photopolymerization initiator has a sensitivity.

The photosensitive silver halide used in the image forming medium may include silver chloride, silver bromide, silver chlorobromide, silver iodobromide, and silver chlorodobromide. These may have been subjected to chemical sensitization and optical sensitization as done in respect of usual photographic emulsions. More specifically, the chemical sensitization that can be used includes sulfur sensitization, noble metal sensitization, and reduction sensitization. The optical sensitization that can be applied includes methods using conventionally known sensitizing colering matters.

the sensitizing coloring matters that may be preferably used include cyanine coloring matters, merocyanine coloring matters, and trinuclear coloring matters, as exemplified by 3,3'-dicarboxyethyl-2,2'-thiacarbocyanine iodide, 3,3'-diethyl-2,3'-thiacarbocyanine iodide, 3,3'-disulfoethyl-2,2'-thiadicarbocyanine bromide, 3,3'-diethyl-2,2'-thiatricarbocyanine iodide, and further the coloring matters having the following structural formula:

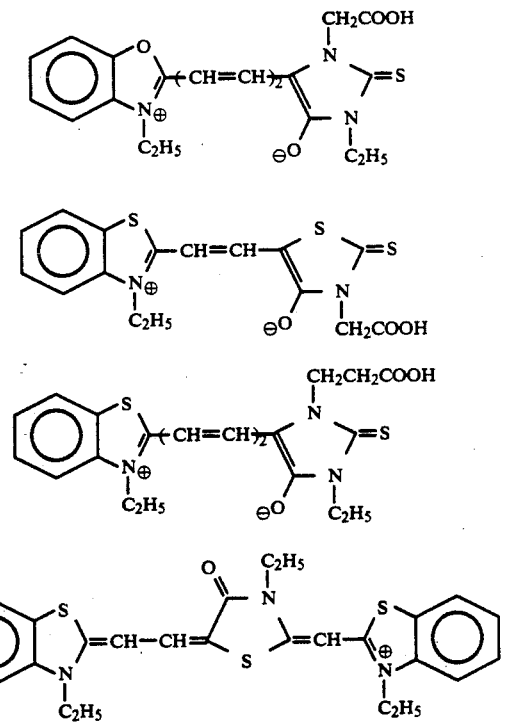

The halogen composition in a grain may be uniform, or the grain may have a multi-layer structure with different composition. It is also possible to use two or more kinds of silver halides having different halogen composition, grain size, grain size distribution, etc.

The organic silver salt that can be used in the image forming medium includes organic acid silver salts or triazole silver salts as described in SHASHIN KOGAKU NO KISO (Basic Photographic Engineering), First Edition, published 1982, The Non-silver Salt Volume, p.247, or Japanese Patent Application Laid-open No. 59-55429. It is preferred to use silver salts having a low photosensitivity. They include, for example, silver salts or aliphatic carboxylic acids, aromatic carboxylic acids, thiocarbonyl compounds having a mercapto group or α-hydrogen, and imino group-containing compounds.

The aliphatic carboxylic acids include acetic acid, butyric acid, succinic acid, sebacic acid, adipic acid, oleic acid, linolic acid, lenolenic acid, tartaric acid, palmitic acid, stearic acid, behenic acid and camphor acid. In general, however, silver salts are not stabler as they have a smaller number of carbon atoms, and hence those having an appropriate number of carbon atoms (as exemplified by those having 12 to 26 carbon atoms) are preferred.

The aromatic carboxylic acids include benzoic acid derivatives, quinolinic acid derivatives, naphthalene carboxylic acid derivatives, salicylic acid derivatives, gallic acid, tannic acid, phthalic acid, phenyl acetic acid derivatives, and pyromellitic acid.

The compounds having a mercapto or thiocarbonyl group include 3-mercapto-4-phenyl-1,2,4-triazole, 2-mercaptobenzoimidazole, 2-mercapto-5-aminothiadiazole, 2-mercaptobenzothiazole, s-alkylthioglycolic acid (alkyl group carbon atoms number of 12 to 22), dithiocarboxylic acids such as dithioacetic acid, thioamides such as thiostearoamide, and mercapto compounds such as 5-carboxy-1-methyl-2-phenyl-4-thiopyridine, mercaptotriazine, 2-mercaptobenzoxazole, mercaptooxazole, and 3-amino-5-benzylthio-1,2,4-triazole, which are described in U.S. Pat. No. 4,123,274.

The compounds having an imino group typically include benzotriazole or derivatives thereof, described in Japanese Patent Publication No. 44-30270 or No. 45-18416, as exemplified by benzotriazole and alkyl-substituted benzotriazoles such as methylbenzotriazole, halogen-substituted benzotriazoles such as 5-chlorobenzotriazole, carboimidobenzotriazoles such as butylcarboimidobenzotriazole, nitrobenzotriazoles, described in Japanese Patent Application Laid-open No. 58-118639, sulfobenzotriazole, carboxybenzotriazole or salts thereof, or hydroxybenzotriazole, described in Japanese Patent Application Laid-open No. 58-115638, 1,2,4-triazole, described in U.S. Pat. No. 4,220,709, or 1H-tetrazole, carbazole, saccharin, imidazole, and derivatives thereof.

The reducing agent that turns into the light-absorbing compound as a result of oxidation-reduction reaction includes, for example, the compound represented by the following Formula (I):

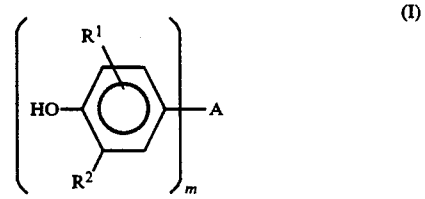

In the above Formula (I), $R^1$ and $R^2$ each independently represent a hydrogen atom, a hydroxyl group, a halogen atom, a substituted or unsubstituted alkyl group, a substituted or unsubstituted alkenyl group, a substituted or unsubstituted alkynyl group, a substituted or unsubstituted cycloalkyl group, a substituted or unsubstituted aralkyl group, an alkoxyl group, or a substituted or unsubstituted amino group; m represents an integer of 1 to 3; and A is monovalent, divalent or trivalent connecting group and represents a substituted or unsubstituted aralkyl group, a substituted or unsubstituted alkyl group, a substituted amino group, a divalent alkylidene group, a divalent aralkylidene group, or a trivalent methine group.

In the above Formula (I), The unsubstituted alkyl group represented by $R^1$ and $R^2$ may preferably include a straight-chain or branched alkyl having 1 to 18 carbon atoms, as exemplified by methyl, ethyl, propyl, i-propyl, butyl, t-butyl, i-butyl, amyl, i-amyl, sec-amyl, texyl, hexyl, heptyl, octyl, nonyl, dodecyl, and stearyl.

The substituted alkyl group represented by $R^1$ and $R^2$ may preferably include an alkoxyalkyl group having 2 to 18 carbon atoms, a halogenoalkyl group having 1 to 18 carbon atoms, a hydroxyalkyl group having 1 to 18 carbon atoms, and an aminoalkyl group having 1 to 18 carbon atoms.

For example, the alkoxyalkyl group includes methoxyethyl, ethoxymethyl, ethoxyethyl, ethoxypropyl, ethoxybutyl, propoxymethyl, propoxybutyl, i-propoxypentyl, t-butoxyethyl, and hexyloxybutyl.

The halogenoalkyl group includes, for example, chloromethyl, chloroethyl, bromoethyl, chloropropyl, chlorobutyl, chlorohexyl, and chloroxyl.

The hydroxyalkyl group includes, for example, hydroxymethyl, hydroxyethyl, hydroxypropyl, hydroxybutyl, hydroxypentyl, hydroxyhexyl, and hydroxyheptyl.

The aminoalkyl group includes, for example, aminomethyl, acetylaminomethyl, dimethylaminomethyl, aminoethyl, acetylaminoethyl, dimethylaminoethyl, diethylaminoethyl, morpholinoethyl, piperidinoethyl, diethylaminopropyl, dipropylaminoethyl, acetylaminopropyl, aminobutyl, and morpholinobutyl.

The alkenyl group represented by $R^1$ and $R^2$ includes, for example, vinyl, allyl, pulenyl, butenyl, pentenyl, hexenyl, heptenyl, and octenyl.

The alkynyl group includes, for example, acetyl propagyl, butynyl, pentynyl, hexynyl, heptynyl, and octynyl.

The cycloalkyl group includes, for example, cyclopentyl, cyclohexyl, and cycloheptyl.

The aralkyl group represented by $R^1$ and $R^2$ includes, for example, beyzyl, phenetyl, and tolylmethyl.

The amino group represented by $R^1$ and $R^2$ include, for example, acetylamino, diemthylamino, diethylamino, and amino.

The alkoxyl group represented by $R^1$ and $R^2$ includes, for example, methoxy, ethoxy, and propoxy.

Of the above, the substituents preferred as $R^2$ are a chlorine atom, a bromine atom, methyl, ethyl, i-propyl, t-butyl, sec-amyl, texyl, ethoxymethyl, ethoxyethyl, chloromethyl, hydroxymethyl, aminomethyl, dimethylaminomethyl, and benzyl. The substituents preferred as $R^1$ are a chlorine atom, methyl, ethyl, i-propyl, t-butyl, amyl, texyl, hydroxyl, chloromethyl, hydroxymethyl, benzyl, and cyclohexyl.

As A, the monovalent group substituent or unsubstituted aralkyl group includes, for example, benzyl, p-methoxybenzyl, p-N,N-dimethylaminobenzyl, p-pyrrolidinobenzyl, p-methylbenzyl, p-hydroxybenzyl, p- chlorobenzyl, 3,5-dichloro-4-hydroxybenzyl, 3-methyl-5-t-butyl-4-hydroxybenzyl, o,p-dimethylbenzyl, 3,5-dimethyl-4-hydroxybenzyl, 2-hydroxy-3-t-butyl-5-methylbenzyl, and naphthylmethyl.

As the A, the monovalent group substituted or unsubstituted alkyl group includes, for example, methyl, ethyl, i-propyl, N,N-dimethylaminomethyl, N-benzylaminomethyl, methoxymethyl, ethoxymethyl, hydroxymethyl, methoxycarbonylethyl, methoxycarbonylmethyl, ethoxycarbonylethyl, and diethyl phosphonatomethyl.

The monovalent group substituted amino group includes, for example, methylamino, dimethylamino, diethylamino, acetylamino, phenylamino, diphenylamino, and triazinylamino.

The divalent group alkylidene group includes, for example, methylene, ethylidene, propylidene, and butylidene.

The divalent group aralkylidene group includes, for example, benzylidene, p-methylbenzylidene, and p-dimethylaminobenzylidene.

Of the above, preferred connecting groups as A are a monovalent aralkyl group, and a divalent alkylidene group or aralkylidene group, and a trivalent methine group. Particularly preferred groups are a monovalent aralkyl group, a divalent alkylidene group and a divalent aralkylidene group.

Of the reducing agents represented by Formula (I), examples of preferred reducing agents are set out below, but are by no means limited to these.

They include 2,4-dimethyl-6-t-butyl, 2-methyl-4-i-propyl-6-t-butylphenol, 2,6-di-t-butyl-4-dimethylaminophenol, 2,6-di-t-butyl-4-hydroxymethylphenol, 2-t-butyl-6-benzyl-4-methylphenol, 2,6-di-t-butyl-4-o-tolymethylphenol, 2,6-di-t-butyl-4-benzylphenol, 2-t-butyl-4-(p-methoxybenzyl)-5-methylphenol, 2,6-dimethyl-4-(α-naphthylmethyl)phenol, 2,6-di-t-butyl-4-(2-hydroxy-3-t-butyl-5-methylbenzyl)phenol, 2-t-butyl-4-(p-chlorobenzyl)-6-cyclohexylphenol, 2-t-butyl-4-(2-hydroxy-3,5-dimethylbenzyl)-5-methylphenol, 2-t-butyl-4-benzyl-6-propagylphenol, 2,6-di-t-butyl-4-(3,5-dichloro-4-hydroxybenzyl)phenol, 2,6-di-t-butyl-4-(3,5-dimethyl-4-hydroxybenzyl)phenol, 2,6-ditexyl-4(4-hydroxybenzyl)phenol, 2-texyl-4-benzyl-5-methylphenol, 2-allyl-4-benzyl-5-methylphenol, 2-texyl-4-(p-chlorobenzyl)-5-allylphenol, 2-chloro-4-dimethylaminomethylphenol, 2,6-di-i-propyl-4-diethylaminophenol, 2-t-butyl-4(2-hydroxy-3-t-butyl-5-methylbenzyl)phenol, 4,4'-methylenebis(2,6-di-t-butylphenol), 4,4'-methylenebis(2-t-butyl-5-methylphenol), 4,4'-methylenebis(2-t-butyl-6-methylphenol), 4,4'-methylenebis(2-texyl-6-methylphenol), 4,4'-methylenebis(2-cyclohexyl-6-methylphenol), 4,4'-methylenebis(2-cyclohexyl-6-t-butylphenol), 4,4'-ethylidenebis(2,6-di-t-butylphenol), 4,4'-ethylidenebis(2-t-butyl-6-methylphenol), 4,4'-ethylidenebis(2-cyclohexyl-6-methylphenol), 4,4'-ethylidenebis(2-texyl-6-methylphenol), 4,4'-propylidenebis(2,6-di-t-butylphenol), 4,4'-butylidenebis(2-t-butyl-6-methylphenol), 4,4'-butylidenebis(2-texyl-6-methylphenol), 4,4'-butylidenebis(2-cyclohexyl-6-methylphenol), bis(3,5-di-t-butyl-4-hydroxyphenyl)phenylmethane, bis(3,5-di-t-butyl-4-hydroxyphenyl) (4-methoxyphenyl)methane, bis(3,5-di-t-butyl-4-hydroxyphenyl)(4-dimethylaminophenyl)methane, tris(3,5-di-t-butyl-4-hydroxyphenyl)methane, and bis(3-t-butyl-4-hydroxy-5-methylphenyl)phenylmethane.

Of these, particularly preferred reducing agents are 2,6-di-t-butyl-4-o-tolylmethylphenol, 2,6-di-t-butyl-4-benzylphenol, 2,6-di-t-butyl-4-(2-hydroxy-3-t-butyl-5-methylbenzyl)phenol, 2,6di-t-butyl-4-(3,5-dichloro-4-hydroxybenzyl)phenol, 2-t-butyl-4-(2-hydroxy-3,5-dimethylbenzyl)-5-methylphenol, 4,4'-methylenebis(2,6-di-t-butylphenol), 4,4'-methylenebis(2-t-butyl-5-methylphenol), 4,4'-methylenebis(2-t-butyl-6-methylphenol), 4,4'-ethylidenebis(2,6-di-t-butylphenol), 4,4'-ethylidenebis(2-t-butyl-6-methylphenol), 4,4'-propylidenebis(2,6-di-t-butylphenol), 4,4'-butylidenebis(2-cyclohexyl-6-methylphenol), bis (3,5-di-t-butyl-4-hydroxyphenyl)phenylmethane, bis(3,5-di-t-butyl-4-hydroxyphenyl)(4-methoxyphenyl)methane, bis(3,5-di-t-butyl-4-hydroxyphenyl)(4-dimethylaminophenyl)methane, and tris(3,5-di-t-butyl-4-hydroxyphenyl)methane.

As the reducing agent that turns into the light-absorbing compound as a result of oxidation-reduction reaction, the compound represented by the following Formula (II) can also be used.

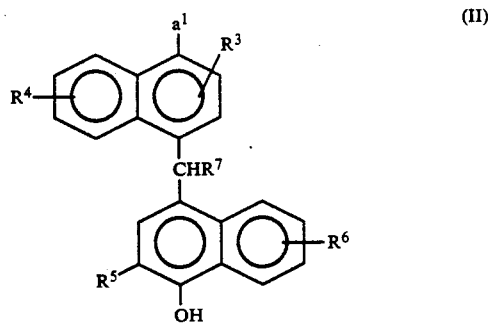

(II)

In the above Formula (II), $R^5$ represents a hydrogen atom, an alkyl group, a cycloalkyl group, or an aralkyl group; $R^3$, $R^4$ and $R^6$ each independently represent a hydrogen atom, a halogen atom, an alkyl group, an amino group, an aryl group, an aralkyl group, an alkoxyl group, a nitro group, an acyl group, or a cyano group; $R^7$ represents a hydrogen atom, a substituted or unsubstituted alkyl group, or a substituted or unsubstituted aryl group; and $a^1$ represents a hydrogen atom, a hydroxyl group, a halogen atom, a substituted or unsubstituted alkyl group, a cycloalkyl group, an alkoxyl group, or a substituted or unsubstituted amino group.

The halogen atom represented by $a^1$, $R^3$, $R^4$ and $R^6$ in the Formula (II) includes a fluorine atom, a chlorine atom, a bromine atom, and an iodine atom.

The alkyl group represented by $a^1$, $R^3$, $R^4$, $R^5$, $R^6$ and $R^7$ may preferably be a substituted or unsubstituted straight-chain or branched alkyl group having 1 to 18 carbon atoms, including, for example, a straight-chain or branched hydrocarbon group such as methyl, ethyl, propyl, i-propyl, butyl, t-butyl, i-butyl, amyl, i-amyl, hexyl, texyl, heptyl, octyl, nonyl, dodecyl, or stearyl; a straight-chain or branched alkoxyalkyl group such as methoxyethyl, ethoxyethyl, ethoxypropyl, ethoxybutyl, propoxybutyl, i-propoxypentyl, t-butoxyethyl, or hexyloxybutyl; a hydroxyalkyl group such as hydroxymethyl, hydroxyethyl, hydroxypropyl, hydroxybutyl, hydroxypentyl, hydroxyhexyl, or hydroxyheptyl; an aminoalkyl or alkylaminoalkyl group such as aminomethyl, dimethylaminomethyl, aminoethyl, dimethylaminoethyl, diethylaminoethyl, morpholinoethyl, peiperidinoethyl, aminopropyl, diethylaminopropyl, dipropylaminoethyl, aminobutyl, or morpholinobutyl.

The cycloalkyl group represented by $a^1$ and $R^5$ may preferably be a substituted or unsubstituted cycloalkyl group having 5 to 18 carbon atoms, including, for example, cyclopentyl, cyclohexyl, cycloheptyl, cyclooctyl, methylcyclohexyl, dimethylcyclohexyl, and ethylcyclohexyl.

The amino group represented by $a^1$, $R^3$, $R^4$ and $R^6$ may be a substituted or unsubstituted amino group, including, for example, amino, acetylamino, methylamino, dimethylamino, diethylamino, pyrrolidino, morpholino, benzenesulfonamido, toluenesulfonamido, dipropyamino and dibutylamino.

The aryl group represented by $R^3$, $R^4$, $R^6$ and $R^7$ may preferably be a substituted or unsubstituted aryl group having 6 to 16 carbon atoms, including, for example, phenyl, naphthyl, anthryl, phenanthryl, tolyl, xylyl, cumenyl, mesityl, chlorophenyl, methoxyphenyl, and fluorophenyl.

The alkoxy group represented by $a^1$, $R^3$, $R^4$ and $R^6$ may preferably be a substituted or unsubstituted alkoxy group having 1 to 18 carbon atoms, including, for example, methoxy, ethoxy, propoxy, i-propoxy, and butoxy.

The aralkyl group represented by $R^3$, $R^4$, $R^5$ and $R^6$ may preferably be a substituted or unsubstituted aralkyl group having 7 to 19 carbon atoms, including, for example, benzyl, phenetyl, benzhydryl, trityl, phenylpropyl, naphthylmethyl, chlorobenzyl, dichlorobenzyl, methoxybenzyl, and methylbenzyl.

The acyl group represented by $R^3$, $R^4$ and $R^6$ includes acetyl and propionyl.

Examples of the compound represented by Formula (II) having the above substituent include 4,4'-methylenebis(2-methyl-1-naphthol), 4,4'-methylenebis(2-ethyl-1-naphthol), 4,4'-methylenebis(2-t-butyl-1-naphthol), 4,4'-methylenebis(2-cyclohexy-1-naphthol), 4,4'-methylenebis(2-t-butyl-6-methyl-1-naphthol), 4,4'-methylenebis(2,6-diethyl-1-naphthol), 4,4'-methylenebis(2-benzyl-1-naphthol), 4,4'-methylenebis(2-t-butyl-8-methyl-1-naphthol), 4,4'-methylenebis(2-methyl-5-chloro-1-naphthol), 4,4'-methylenebis(2-methyl-8-dimethylamino-1-naphthol), 4,4'-methylenebis(2-methyl-5-benzyl-1-naphthol), 4,4'-methylenebis(2-methyl-5-methoxy-1-naphthol), 4,4'-methylenebis(2-methyl-5-phenyl-1-naphthol, 4,(3'-cyclohexyl- 4'-hydroxynaphthyl)methyl-2-methyl-1-napthol, 4-(3-t-butyl-4'-hydroxynaphtyl)methyl-2-methyl-1-naphthol, 4-(3'-cyclohexyl-4'-hydroxynaphthyl)methyl-2-t-butyl-1-naphthol, 4,4'-benzylidenebis(2-methyl-1-naphthol), 4,4'-benzylidenebis(2-methyl-1-naphthol), 4,4'-benzylidenebis(2-t-butyl-1-naphthol), 4,4'-ethylidenebis(2-methyl-1-naphthol), 4,4'-ethylidenebis(2-t-butyl-1-naphthol), and bis(4-hydroxy-3-methylnaphthyl)tolymethane.

As another reducing agent that turns into the light-absorbing compound as a result of oxidation-reduction reaction, the compound represented by the following Formula (III) can also be used.

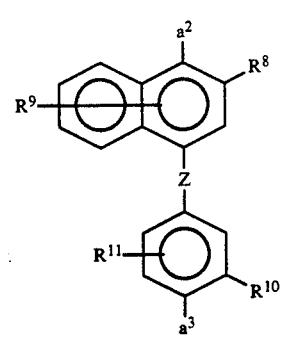

(III)

In the Formula (III), $R^8$, $R^9$, $R^{10}$ and $R^{11}$ each independently represent a hydrogen atom, a halogen atom, a substituted or unsubstituted alkyl group, a cycloalkyl group, an alkoxyl group, a substituted or unsubstituted aralkyl group, a substituted or unsubstituted aryl group, a substituted or unsubstituted amino group, a nitro group, or an acyl group; Z represents a divalent group; and $a^2$ and $a^3$ each represent a hydrogen atom, a hydroxy group, a halogen atom, a substituted or unsubstituted alkyl group, an alkoxyl group, and a substituted or unsubstituted amino group, provided that at least one of $a^2$ and $a^3$ is a hydroxyl group.

In the Formula (III), the halogen atom represented by $R^8$, $R^9$, $R^{10}$, $R^{11}$, $a^2$ and $a^3$ includes a fluorine atom, a chlorine atom, a bromine atom, and an iodine atom.

In the Formula (III), the alkyl group represented by $R^8$, $R^9$, $R^{10}$, $R^{11}$, $a^2$ and $a^3$ may preferably be a straight-chain or branched alkyl group having 1 to 18 carbon atoms, including, for example, methyl, ethyl, propyl, i-propyl, butyl, t-butyl, i-butyl, amyl, i-amyl, sec-amyl, texyl, hexyl, heptyl, octyl, nonyl, dodecyl, and stearyl, The substituted alkyl group may preferably include an alkoxyalkyl group having 2 to 18 carbon atoms, a halogenoalkyl group having 1 to 18 carbon atoms, a hydroxyalkyl group having 1 to 18 carbon atoms, and an aminoalkyl group having 1 to 18 carbon atoms, specifically including, for example, methoxyethyl, ethoxymethyl, ethoxyethyl, ethoxypropyl, ethoxybutyl, propoxybutyl, i-propoxypentyl, t-butoxyethyl, hexyloxybutyl, chloromethyl, chloroethyl, bromoethyl, chloropropyl, chlorobutyl, chlorohexyl, chlorooctyl, hydroxymethyl, hydroxyethyl, hydroxypropyl, hydroxybutyl, hydroxypentyl, hydroxyhexyl, hydroxyheptyl, aminomethyl, acetylaminomethyl, dimethlaminomethyl, aminoethyl, acetylaminoethyl, dimethylaminoethyl, diethylaminoethyl, morpholinoethyl, pyperidinoethyl, diethylaminopropyl, dipropylaminoethyl, aminopropyl, acetylaminopropyl, aminobutyl, and morpholinobutyl.

The aryl group represented by $R^8$, $R^8$, $R^{10}$ and $R^{11}$ includes, for example, phenyl, naphthyl, anthryl, and phenanthryl. The substituted aryl group includes, for example, tolyl, xylyl, cumenyl, mesityl, chlorophenyl, methoxyphenyl, and fluorophenyl.

The aralkyl group represented by $R^8$, $R^9$, $R^{10}$ and $R^{11}$ includes, for example, benzyl, phenethyl, benzhydryl, trityl, phenylpropyl, and naphthylmethyl. The substituted aralkyl group includes, for example, chlorobenzyl, dichlorobenzyl, methoxybenzyl, and methylbenzyl.

The cycloalkyl group represented by $R^8$, $R^9$, $R^{10}$, $R^{11}$, $a^2$ and $a^3$ includes, for example, a cycloalkyl group with a ring of 5, 6 or 7 members, which may be substituted with an alkyl group.

The alkoxy group represented by $R^8$, $R^9$, $R^{10}$, $R^{11}$, $a^2$ and $a^3$ includes, for example, methoxy, ethoxy, propoxy, butoxy, i-propoxy, benzyloxy, and 2-phenylethoxy.

The substituted or unsubstituted amino group represented by $a^2$ and $a^3$ includes, for example, amino, acetylamino, phenylamino, diethylamino, cyclopentylamino, cyclopentylmethylamino, cyclohexylamino, piperidino, and pyrrolidino.

Z represents a divalent group, and is exemplified by an alkylene group and an aralkylene group. Specifically, it preferably includes methylene, ethylene, propylidene, benzylidene, cinnamylidene, p-hydroxybenzylidene, p-methylbenzylidene, and p-dimethylaminobenzylidene.

Examples of the compound represented by Formula (III) having the above-mentioned substituents include 2-methyl-4-(3,5-dimethyl-4-hydroxyphenyl)methyl-1-naphthol, 2-methyl-4-(3,5-di-t-butyl-4-hydroxyphenyl)-methyl-1-naphthol, 2-methyl-4-(4-hydroxyphenyl)-methyl-1-naphthol, 2-methyl-4-tolylmethyl-1-naphthol, 2-methyl-4-benzyl-1-naphthol, 2-t-butyl-4-(4-hydroxyphenyl)methyl-1-naphthol, 2-methyl-4-(3,5-dichloro-4-hydroxyphenyl)methyl-1-naphthol, 2-ethyl-4-(3,5-di-t-butyl-4-hydroxyphenyl)methyl-1-naphthol, 2-methyl-4-(3,5-dimethoxy-4-hydroxyphenyl)methyl-1-naphthol, 2-methyl-4-(3-methyl-4-hydroxyphenyl)methyl-1-naphthol, 2-t-butyl-4-(3-t-butyl-4-hydroxyphenyl)methyl-1-naphthol, 2,6-di-t-butyl-4-α-naphthylmethylphenol, 2,6-di-t-butyl-4-methoxynaphthylmethylphenol, 2-methyl-4-(3-chloro-4-hydroxyphenyl)methyl-1-naphthol, 2-methyl-4-(4-dimethylaminophenyl)methyl-1-naphthol, 2-ethyl-4-diphenylmethyl-1-naphthol, 2-methyl-4-(3-cyclohexyl-4-hydroxyphenyl)-methyl-1-naphthol, 2-methyl-4-(3-phenyl-4-hydroxyphenyl)-methyl-1-naphthol, 2-methyl-4-(3-t-butyl-4-hydroxy-5-methylphenyl)methyl-1-naphthol, and 2-methyl-4-benzyl-6-methyl-1-naphthol.

Of the above reducing agents of Formulas (I), (II) and (III), two or more ones may be used in combination.

In addition to the above reducing agents, leuco compounds of coloring matters that can be reduced can be used as the reducing agent that turns into the light-absorbing compound. Preferred leuco compounds include, for example, azo dyes, azomethine dyes, triarylmethane dyes, xanthene dyes, azine dyes, indigoid dyes, formazan dyes, nitro dyes, nitroso dyes, and azoxy dyes. Particularly preferred are leuco compounds such as azomethine dyes, triarylmethane dyes, xanthene dyes, azine dyes and indigoid dyes. To further improve the stability of these leuco compounds, these can also be used in the form in which the hydroxyl group or amino group has been acylated or sulfonylated. Preferred examples of the leuco compounds include, for example, α-benzoyl-α-(p-diethylanilino)acetanilide, α-benzoyl-α-(p-diethylamino-o-methyl-anilino)aceto-o-chloroanilide, α-benzoyl-α-(p-dimethylaminoanilino)aceto-o-methoxyanilide, Crystal Violet Hydrol, 9-phenyl-2,7-dichloro-3,6-dihydroxyxanthene, 9-phenyl-2,4,5,7-tetrachloro-3,6-dihydroxyxanthene, 9-phenyl-4,5-dimethyl-3,6-dihydroxyxanthene, and 9-phenyl-3-diethylamino-6-hydroxy-7-chloroxanthene.

The reducing agent participating in the case that the oxidized product produced as a result of the oxidation-reduction reaction is further react with a coupler to produce the light-absorbing compound, may include, for example, secondary color developing agents. Preferred secondary color developing agents includes, for example, p-aminophenols, p-phenylenediamines, and o-aminophenols.

Also usable as the secondary color developing agent are hydrazines as disclosed in Japanese Patent Application Laid-open No. 56-27132, sulfoamidophenols as disclosed in U.S. Pat. No. 4,021,240, and also a compound capable of producing an aromatic primary amine as a result of heating, as disclosed in Japanese Patent Application Laid-open No 59-53831. Examples of the secondary color developing agent that can be preferably used include 4-amino-N,N-diethylaniline, 2-amino-5-diethylaminotoluene, 4-amino-N,N-diethyl-3-(β-hydroxyethyl)aniline, 4-amino-N,N-bis(β-hydroxyethyl)3-methylaniline, p-aminophenol, p-amino-o-cresol, o-aminophenol, and o-amino-p-cresol. These may be used as they are, or may be used in the form of salts such as a hydrochloride, a sulfate, a phosphate, a p-toluenesulfonate, a benzenesulfonate, and a naphthalenedisulfonate.

The coupler may preferably include α-acylacetamides, pyrazolones, phenols, and naphthols. These are described in "SHASHIN NO KAGAKU (Chemistry of Photography)", First Edition, Shashin Kogyo Shuppansha, pp. 278–282, or T. H. James, "The Theory of the Photographic Process", Fourth Edition, Macmillan Publishing Co., Inc., pp. 353–361. Examples of the coupler include benzoylacetanilide, benzoylaceto-o-methoxyanilide, benzoylaceto-o-chloroanilide, 1-phenyl-3-(4'-nitrobenzamido)-5-pyrazolone, 1-phenyl-3-[m-(p-t-amylphenoxy)benzamido]-5-pyrazolone, 2-chloro-1-naphthol, and 5-isopropyl-o-cresol. Indazolones or cyanoacetyls can also be used as the coupler.

A reducing agent that does not turn into the light-absorbing compound as a result of the oxidation-reduction reaction may also be contained in the image forming medium used in the present invention so long as the object of the present invention may not be hindered.

The reducing agent utilizable as the reducing agent that does not turn into the light-absorbing compound as a result of the oxidation-reduction reaction but can be contained in the image forming medium used in the present invention includes, for example, phenols, hydroquinones, catechols, p-aminophenols, 3-pyrazolidones, resorcins, pyrogallols, m-aminophenols, m-phenylenediamines, 5-pyrazolones, alkylphenols, alkoxyphenols, naphthols, aminonaphthols, naphthalenediols, alkoxynaphthols, hydrazines, hydrazones, hydroxycuromane, hydroxycoumarans, sulfonamide phenols, aminonaphthols, ascorbic acids, hydroxyindanes, and orthobisphenols. Leuco bases obtained by reduction of coloring matters can also be used as the reducing agent.

The photopolymerization initiator includes, for example, carbonyl compounds, sulfur compounds, halogen compounds, photopolymerization initiators of redox type, and peroxide initiators sensitized with a dye such as pyrylium.

Specifically, the carbonyl compounds include diketones as exemplified by benzyl, 4,4'-dimethoxybenzyl, diacetyl, and camphorquinone; benzophenones as exemplified by 4,4'-bis(diethylamino)benzophenone and 4,4'-dimethoxybenzophenone; acetophenones as exemplified by acetophenone, 4-methoxyacetophenone; benzoin alkyl ethers; thioxanthones as exemplified by 2-chlorothioxanthone, 2,4-dichlorothioxanthone, 2,4-diethylthioxanthone, and thoxanthone-3-carboxylic acid-β-methoxy ethyl ester; chalcones and styrylketones having a dialkylamino group; and cumarines as exemplified by 3,3'-carbonylbis(7-methoxycumarine), and 3,3'-carbonylbis(7-diethylaminocumarine).

The sulfur compounds include, for example, dibenzothiazolyl sulfide, decylphenyl sulfide and disulfides.

The halogen compounds include, for example, carbon tetrabromide, quinolinesulfonyl chloride, and S-triazines having a trihalomethyl group.

The photopolymerization initiators or redox type include those used in combination of a trivalent iron ionic compound (as exemplified by ferric ammonium citrate) with a peroxide, and those used in combination of a photoreducing coloring matter such as riboflavin or Methylene Blue with a reducing agent such as triethanolamine or ascorbic acid.

In the photopolymerization initiator described above (including the sensitizer), two or more photopolymerization initiators can also be used in combination to obtain a more efficient photopolymerization reaction.

Such combination of the photopolymerization initiators includes a combination of chalcones having a dialkylamino group and styrylketones or cumarins, with S-triazines having a trihalomethyl group or camphorquinone.

In the image forming medium used in the present invention, preferably used are photopolymerization initiators having a photosensitive wavelength region of from 370 nm to 520 nm.

The image forming medium used in the present invention, the photopolymerization initiator to be used is required to be appropriately selected depending on the light-absorption characteristics of the light-absorbing compound produced as a result of the oxidation-reduction reaction of the reducing agent. Examples of such combination of the reducing agent and photopolymerization initiators are set out below.

When, for example, 4,4'-propylidenebis(2,6-di-t-butylphenol), 4,4'-butylidenebis(3-methyl-6-t-butylphenol), 4,4'-methylenebis(2,6-di-t-butylphenol), 4,4'-methylenebis(2-t-butyl-6-methylphenol), 2,6-di-t-butyl-4-(3,5-dimethyl-4-hydroxyphenyl)methylphenol, 2-methyl-4-(3,5-dimethyl-4-hydroxyphenyl)methyl-1-naphthol, etc. are used as the reducing agent, preferred are photopolymerization initiators having sensitivity at 380 nm to 420 nm, as exemplified by 2-chlorothioxanthone, 2-methylthioxanthone, 2,4-dimethylthioxanthone, 2,4-diethylthioxanthone, 3,3'-carbonylbis(7-methoxycumarine), 2,4,6-trimethylbenzoyldiphenylphosphine oxide, and benzyl.

When, for example, 2,6-di-t-butyl-4-(2-hydroxy-3-t-butyl-5-methylbenzyl)phenol, 2,6-di-t-butyl-4-benzylphenol, 2,6-di-t-butyl-4-o-trimethylphenol, etc. are used as the reducing agent, preferred are photopolymerization initiators having sensitivity at 300 nm to 380 nm, as exemplified by 1-phenyl-2-hydroxy-2-methylpropane-1-one, 1-hydroxycyclohexyl phenyl ketone, benzyl dimethyl ketal, benzophenone, and 4-benzoyl-4'-methyldiphenyl sulfide.

When, for example, bis(3,5-di-t-butyl-4-hydroxyphenyl)-(4-dimethylaminophenyl)methane, 4,4'-methylenebis(2-methyl-1-naphthol), 4,4'-methylenebis(2-ethyl-1-naphthol), 4,4'-methylenebis(2-cyclohexyl-1-naphthol), 4,4'-methylenebis(2-t-butyl-1-naphthol), etc. are used as the reducing agent, preferred are combinations of photopolymerization initiators having sensitivity of 400 nm to 520 nm, as exemplified by 3,3'-carbonylbis(7-dimethylaminocumarine), riboflavin tetrabutylate, or merocyanine dyes, with trichloromethyl-S-triazine compounds.

As the polymerizable polymer precursor, a compound having at least one reactive vinyl group in its molecule can be utilized.

The reactive vinyl group in these compounds includes substituted or unsubstituted vinyl groups having polymerization reactivity, as exemplified by styrene vinyl group, acrylic acid vinyl groups, methacrylic acid vinyl groups, allyl vinyl groups, and vinyl ethers, as well as ester vinyl groups such as vinyl acetate.

Examples of the polymerizable polymer precursor satisfying such conditions are as follows.

They include, for example;

monovalent monomers such as styrene, methylstyrene, chlorostyrene, bromostyrene, methoxystyrene, dimethylaminostyrene, cyanostyrene, nitrostyrene, hydroxystyrene, aminostyrene, carboxystyrene, acrylic acid, methyl acrylate, ethyl acrylate, cyclohexyl acrylate, acrylamide, methacrylic acid, methyl methacrylate, ethyl methacrylate, propyl methacrylate, butyl methacrylate, phenyl methacrylate, cyclohexyl methacrylate, vinyl pyridine, N-vinylpyrrolidone, N-vinylimidazole, 2-vinylimidazole, N-methyl-2-vinylimidazole, propyl vinyl ether, butyl vinyl ether, isobutyl vinyl ether, β-chloroethyl vinyl ether, phenyl vinyl ether, p-methylphenyl vinyl ether, and p-chlorophenyl vinyl ether;

divalent monomers such as divinylbenzene, distyryl oxalate, distyryl malonate, distyryl succinate, distyryl glutarate, distyryl adipate, distyryl maleate, distyryl fumarate, distyryl β,β'-dimethylglutarate, distyryl 2-bromoglutarate, distyryl α,α'-dichloroglutarate, distyryl terephthalate, oxalic acid di(ethyl acrylate), oxalic acid di(methyl acrylate), malonic acid di(ethyl acrylate), malonic acid di(methyl ethyl acrylate), succinic acid di(ethyl acrylate), glutaric acid di(ethyl acrylate), adipic acid di(ethyl acrylate), maleic acid di(ethyl acrylate), fumaric acid di(ethyl acrylate), β,β'-dimethylglutaric acid di(ethyl acrylate), ethylenediacrylamide, propylenediacrylamide, 1,4-phenylenediacrylamide, 1,4-phenylenebis(oxyethyl acrylate), 1,4-phenylenebis(oxymethyl ethyl acrylate), 1,4-bis(acryloxyethoxy)cyclohexane, 1,4-bis(acryloyloxymethylethoxy)cyclohexane, 1,4-bis(acryloyloxyethoxycarbamoyl)benzene, 1,4-bis(acryloyloxyethoxycarbamoyl)cyclohexane, bis(acryloyloxyethoxycarbamoylcyclohexyl)methane, oxalic acid di(ethyl methacrylate), oxalic acid di(methyl ethyl methacrylate), malonic acid di(ethyl methacrylate), malonic acid di(methyl ethyl methacrylate), succinic acid di(ethyl methacrylate), succinic acid di(methyl ethyl methacrylate), glutaric acid di(ethyl methacrylate), adipic acid di(ethyl methacrylate), maleic acid di(ethyl methacrylate), fumaric acid di(ethyl methacrylate), fumaric acid di(methyl ethyl methacrylate), β,62 '-dimethylglutaric acid di(ethyl methacrylate), 1,4-phenylenebis(oxyethyl methacrylate), and 1,4-bis(methacryloyloxyethoxy)cyclohexane acryloyloxyethoxyethyl vinyl ether;

trivalent monomers such as pentaerythritol triacrylate, pentaerythritol trimethacrylate, pentaerythritol tri(hydroxystyrene), dipentaerythritol hexaacrylate, cyanuric acid triacrylate, cyanuric acid trimethacrylate, 1,1,1-trimethylolpropane triacrylate, 1,1,1-trimethylolpropane trimethacrylate, cyanuric acid tri(ethyl acrylate), 1,1,1-trimethylolpropane tri(ethyl acrylate), cyanuric acid tri(ethyl vinyl ether), a condensate of a reaction product between 1,1,1-trimethylolpropane and three-fold mols of toluenediisocyanate, with hydroxyethyl acrylate, and a condensate of a reaction product between 1,1,1-trimethylolpropane and three-fold mols of hexanediisocyanate, with p-hydroxystyrene; and tetravalent monomers such as ethylenetetraacrylamide, and propylenetetraacrylamide.

Two or more of these polymerizable polymer precursors may be used in combination as previously mentioned.

For the purpose of improving film formation properties and dispersion, the image forming layer may preferably be incorporated with a suitable binder.

The binder includes, for example;

cellulose ester such as nitrocellulose, cellulose phosphate, cellulose sulfate, cellulose acetate, cellulose propionate, cellulose butyrate, cellulose myrystate, cellulose palmitate, cellulose acetate.propionate, and cellulose acetate.butyrate;

cellulose ethers such as methyl cellulose, ethyl cellulose, propyl cellulose, and butyl cellulose;

vinyl resins such as polystyrene, polyvinyl chloride, polyvinyl acetate, polyvinyl butyral, polyvinyl acetal, polyvinyl alcohol, and polyvinyl pyrrolidone;

copolymer resins such as a styrene/butadiene copolymer, a styrene/acrylonitrile copolymer, a styrene/butadiene/acrylonitrile copolymer, and a vinyl chloride/vinyl acetate copolymer;

acrylic resins such as polymethyl methacrylate, polymethyl acrylate, polybutyl acrylate, polyacrylic acid, polymethacrylic acid, polyacrylamide, and polyacrylonitrile;

polyesters such as polyethylene terephthalate;

polyacrylate resins such as poly(4,4'-isopropylidene, diphenylene-co-1,4-cyclohexylenedimethylene carbonate), poly(ethylenedioxy-3,3'-phenylene thiocarbonate), poly(4,4'-isopropylidene, diphenylene carbonate-coterephthalate), poly(4,4'-isopropylidene,diphenylene carbonate), poly(4,4'-sec-butylidene,diphenylene carbonates), and poly(4,4'-isopropylidene,diphenylene carbonate-block-oxyethylene);

polyamides; polyimides; epoxy resins, phenol resins;

polyolefins such as polyethylene, polypropylene, and chlorinated polyethylene; and natural polymers such as gelatin.

In addition to these, toning agents, antifoggants, alkali generating agents, automatic oxidants, etc. may be optionally added in the image forming medium used in the present invention.

In the image forming medium used in the present invention, the components described above may preferably be used in the proportion as follows:

The organic silver salt may preferably be contained in the image forming layer 12b in an amount of from 0.3 to 30 g/m$^2$, more preferably from 0.7 to 15 g/m$^2$, and particularly preferably from 1.2 to 8 g/m$^2$.

The silver halide may preferably be contained in an amount of from 0.001 mol to 2 mols, and more preferably from 0.05 mol to 0.4 mol, per mol of the organic silver salt. The reducing agent may preferably be contained in an amount of from 0.05 mol to 3 mols, and more preferably from 0.2 mol to 1.3 mol, per mol of the organic silver salt. The photopolymerization initiator may preferably be contained in an amount of from 0.1 part by weight to 30 parts by weight, and more preferably from 0.5 part by weight to 10 parts by weight, based on 100 parts by weight of the polymerizable polymer precursor. The photopolymerization initiator may preferably be contained in an amount of from 0.01 mol to 10 mols, and more preferably from 0.5 mol to 3 mols, per mol of the reducing agent.

The amount of the binder optionally contained in the image forming layer 12b may preferably be in a proportion of from 0 to 10 parts by weight, and more preferably from 0.5 to 5 parts by weight, based on 1 part by weight of the organic silver salt. This proportion also applies in respect to the photosensitive layer 112e. The amount of the binder also optionally contained in the polymerizing layer 112f may preferably be in a proportion of from 0 to 10 parts by weight based on 1 part by weight of the polymerizable polymer precursor.

The components and the proportions of the components that constitute the photosensitive layer 112e and polymerizing layer 112f as shown in FIG. 2 can be considered to be the same as the instance in which the image forming layer is comprised of a single layer.

The image forming medium used in the present invention can be formed by dissolving the above components in a solvent together with a binder appropriately used, and coating the resulting solution on the base film such as metal foil, plastic film, paper, baryta paper or synthetic paper, or, when a strength can be kept by the binder itself, by incorporation, without use of the base film, the above essential components into a film- or sheet-like material formed by the binder.

The image forming layer 12b may preferably have a thickness of from 0.1 μm to 2 mm, and more preferably from 1 μm to 0.1 mm. The base films 12a and 112a may also each preferably have a thickness of from about 2 μm to about 3 mm.

The photosensitive layer 112e and the polymerizing layer 112f may each preferably have a thickness of from 0.05 μm to 1 mm, more preferably from 0.3 μm to 30 μm, and particularly preferably from 0.6 μm to 10 μm.

The coloring material layer 30b of the color transfer recording medium 30 contains a heat-diffusible coloring matter and a binder. The heat-diffusible coloring matter may include, for example, monoazo dyes, thiazole dyes, anthraquinone dyes, triarylmethane dyes, Rhodamine dyes and naphthol dyes. The heat-diffusible coloring matter usually has a larger heat diffusibility with a decrease in its molecular weight, and also has a smaller heat diffusibility when it has more polar groups as exemplified by a carboxyl group, an amino group, a hydroxyl group, a nitro group and a sulfone group. Accordingly, a dye having the desired heat diffusibility may be appropriately selected depending on the degree of polymerization or cross-link density of the image forming medium and the heating conditions in the transfer step, on the basis of its molecular weight and polar groups.

As the binder contained in the coloring material layer 30b, it is possible to use the same binder as the one contained in the image forming layer 12b.

The heat-diffusible coloring matter may preferably be contained in the coloring material layer 30b in an amount of not less than 5% by weight, and more preferably not less than 25% by weight, based on the coloring material layer 30b. The coloring material layer 30b can be comprised of the heat-diffusible coloring matter only. The coloring material layer 30b may preferably have a thickness of from 2 μm to 10 μm.

There are no particular limitations on the image receiving medium 11 so long as the heat-diffusible coloring matter can be well transferred thereto and a good image can be formed thereon. Plain paper may be used without difficulty. It, however, is advantageous to provide an image receiving layer on the base film so that the heat-diffusible coloring matter can be transferred to this image receiving layer. Materials usable for the image receiving layer include, for example, polyester resins, polycarbonate resins, polyvinyl acetate resins, polyurethane resins, polyamide resins, polycaprolactam resins and polyvinyl chloride resins.

The base films used in the color transfer recording medium and the image receiving medium may be the same as the base film used in the image forming medium.

As having been described above, in the present invention, the image receiving medium is secured to the support member and then the image forming medium is superposed on the image received medium, in the state of which the polymer image is formed in this image forming medium. Thus, a doubling-free, or misregistration-free multi-color image can be formed even when images with different colors are formed superposingly on the image receiving medium.

The present invention will be described in greater detail by giving Examples. In the following description, the "part(s)" that indicates a quantitative proportion is on the basis of weight unless particularly referred to.

EXAMPLE 1

Using the apparatus as shown in FIG. 3, a multi-color image was formed on an image receiving medium.

To produce an image forming medium, a dispersion with the following composition was prepared using a homomixer.

| | |
|---|---|
| Behenic acid | 2.5 parts |
| Silver behenate | 4.5 part |
| Silver bromide | 0.7 part |
| Polyvinyl butyral (S-LEC BL-1: a product of Sekisui Chemical Co., Ltd.) | 10.0 parts |
| Trimethylolpropane triacrylate (NK Ester A-TMPT; a product of Shin-Nakamura Chemical Co., Ltd.) | 10.0 parts |
| Ethyl 4-dimethylaminobenzoate (Kayacure EPA, a product of Nippon Kayaku Co., Ltd.) | 0.6 part |
| 2,4-Diethylthioxanthone (Kayacure DETX, a product of Nippon Kayaku Co., Ltd.) | 0.4 part |
| 4,4'-Methylenebis(2,6-di-t-butylphenol) | 3.2 parts |
| Phthalazinone | 0.8 part |
| Xylene | 60.0 parts |
| n-Butanol | 60.0 parts |

To the above dispersion, a solution prepared by dissolving 0.0012 part of sensitizing compound represented by the following structural formula in 1.0 part of N,N-dimethylformamide was added to give a disperion A.

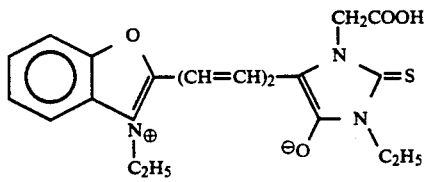

This dispersion A was coated on a polyethylene terephthalate (PET) film so as to give a dried coating thickness of 7 μm. An image forming medium was thus produced.

A color transfer recording medium was formed using the following yellow, magenta and cyan coating solutions.

| | |
|---|---|
| Yellow coating solution: | |
| Polybutyl methacrylate (Dianal BR-79; Mitsubishi Rayon Co. Ltd.) | 7.0 parts |
| MS-Yellow-VP (a dye produce by Mistui Toatsu Chemicals, Inc.) | 1.0 part |
| Methyl ethyl ketone | 63.0 parts |
| Magenta coating solution: | |
| Polybutyl methacrylate (Dianal BR-79; Mitsubishi Rayon Co. Ltd.) | 7.0 parts |
| MS-Magenta-Vp (a dye produced by Mistui Toatsu Chemicals, Inc.) | 1.0 part |
| Methyl ethyl ketone | 63.0 parts |
| Cyan coating solution: | |
| Polybutyl methacrylate (Dianal BR-79; Mitsubishi Rayon Co. Ltd.) | 7.0 parts |
| MS-Cyan-VP (a dye produced by Mistui Toatsu Chemicals, Inc.) | 1.0 part |
| Methyl ethyl ketone | 63.0 parts |

The yellow coating solution, magenta coating solution and cyan coating solution each having the above composition were coated on a 2 μm thick PET film having been subjected to anchoring. These solutions were coated dividedly for each color region, using a three-color gravure coater, to form a coloring material layer. The coloring material layer had a dried coating thickness of 2 μm.

As the image receiving medium, a paper sheet provided thereon with an image receiving layer comprising polyester resin was used.

The image forming medium and the image receiving medium were cut into A4-size sheets, and were put in the cartridges 14 and 13, respectively. The color transfer recording medium was wound in a roll and set on the rollers 32 and 33.

Thus, upon the switching-on of a power source, the image receiving medium was fed from the cartridge 13 through the feed rollers 15 and 16 in the feed zone, and checked to the clip 19 on the support member 2, having a diameter of 150 mm. When the image receiving medium approached to the cartridge 14 as the support member 2 was rotated (peripheral speed: 10 mm/sec), the image forming medium was fed from the cartridge 14 through the rollers 17 and 18 and superposed on the image receiving medium.

At the imagewise exposure zone, the image forming medium on the image receiving medium was imagewise exposed through the exposure means 20 (a He—Ne laser with a wavelength of 633 nm and an output of 5 mW), operating according to image signals for a yellow image. Thereafter, it was delivered further to the heat development zone as the support member 2 was rotated.

At the heat development zone, the image forming medium on the image receiving medium was heated with the heating rollers 23 and 24 and the belt 25. Temperature of the heating rollers 23 and 24 and the belt 25 was 120° C. The length of the contact part through which the belt 25 came into contact with the support member 2 was 100 mm.

Next, the image receiving medium and the image forming medium were delivered to the polymerization exposure zone, and subjected to polymerization exposure through the exposure means 28 (five ultraviolet fluorescent lamps each having an emission peak of 380 nm, a power consumption of 15 W, a diameter of 15 mm and a length of 330 mm). The distance from the periphery of the support member 2 to the tube surface of the fluorescent lamps was 10 mm.

Subsequently, only the PET film was removed from the image forming medium by means of the roller 61, and then the image receiving medium and the image forming medium were delivered to the transfer zone.

At the transfer zone, the color transfer recording medium was laminated on the image forming medium from which the PET film had been removed, which were further heated by means of the heating roller 31. As a result, a yellow image was formed on the image receiving medium. The heating using the heating roller 31 was at a temperature of 110° C. The image forming layer of the image forming medium was adhered to the color transfer recording medium as a result of the heating, peeled from the image receiving medium, and then wound up on the roller 33 together with the color transfer recording medium.

The image receiving medium on which the yellow image had been formed was delivered to the feed zone again.

A magenta image and a cyan image were also formed on the image receiving medium following the same procedure as the yellow image. Thus a multi-color image comprised of the yellow image, magenta image and cyan image superposed on the same image receiving medium was finally formed.

The multi-color image thus formed was doubling-free or misregistration-free and sharp.

EXAMPLE 2

To produce an image forming medium a dispersion with the following composition was prepared using a homomixer.

| Behenic acid | 0.4 part |
|---|---|
| Silver behenate | 0.5 part |
| Silver bromide | 0.1 part |
| Polyvinyl butyral (S-LEC BL-1; a product of Sekisui Chemical Co., Ltd.) | 1.0 part |
| Phthalazinone | 0.2 part |
| 2,6-Di-t-butyl-4-(3,5-dimethyl-4-hydroxybenzyl)phenol | 0.4 part |
| Toluene/isopropanol (1:1) | 10.0 parts |

To the above dispersion, a solution prepared by dissolving 0.0002 part of the same sensitizing compound as used in Example 1 in 0.2 part of N,N-dimethylformamide was added to give a dispersion B.

In a system separate from the above, the following components were added and dispersed using a paint shaker to give a dispersion C.

| Methyl ethyl ketone | 10.0 parts |
|---|---|
| Polymethyl methacrylate | 1.0 part |
| Unideck 16-824 (a product of Dainippon Ink & Chemicals, Incorporated) | 2.0 parts |
| 2,4-Dichlorothioxanthone | 0.2 part |
| Ethyl 4-dimethylaminobenzoate | 0.1 part |

The dispersion B was coated on a PET film so as to give a dried coating thickness of 5 μm to form a photosensitive layer. After the photosensitive layer was dried, the dispersion C was further coated on the photosensitive layer to give a polymerizing layer. Thus an image forming medium of double-layer structure, comprised of the photosensitive layer and the polymerizing layer, was obtained.

Using the image forming medium thus obtained and the same color transfer recording medium and image receiving medium as used in Example 1, a multi-color image was formed on the image receiving medium in the same manner as in Example 1. As a result, a doubling-free, sharp multi-color image was obtained, like that in Example 1. In the present Example, the PET film and photosensitive layer were removed by means of the roller 6 after completion of the polymerization exposure.

EXAMPLE 3

To produce an image forming medium, a dispersion with the following composition was prepared using a homomixer.

| Behenic acid | 4.0 parts |
|---|---|
| Silver behenate | 5.0 part |
| Silver bromide | 0.3 part |
| Reactive binder comprising polyvinyl butyral whose OH group had been substituted with acrylate | 10.0 parts |
| Dipentaerythritol acrylate | 10.0 parts |
| Ethyl 4-dimethylaminobenzoate (Kayacure EPA, a product of Nippon Kayaku Co., Ltd.) | 0.4 part |
| Benzyldimethylketal | 1.7 parts |
| 1-Phenyl-1-(3,5-di-t-butyl-4-hydroxyphenyl)ethane | 2.5 parts |
| MS-Yellow-VP | 2.0 part |
| Phthalazinone | 1.0 part |
| Xylene | 60.0 parts |
| n-Butanol | 60.0 parts |

To the above dispersion, a solution prepared by dissolving 0.002 part of N,N'-diethylthiotricarbocyanine iodide in 0.5 part of N,N-dimethylformamide was added to give a dispersion D.

The dispersion D was coated on a PET film so as to give a dried coating thickness of 7 μm to produce a yellow-image forming medium.

A magenta-image forming medium was produced in the same manner as the yellow-image forming medium except that 2.5 parts of 1-phenyl-1-(3,5-di-t-butyl-4-hydroxyphenyl)ethane, 2.0 parts of MS-Yellow-VP and 1.7 parts of benzyldimethylketal, used in the yellow-image forming medium, were replaced with 2.5 parts of 4,4-methylenebis(2,6-di-t-butylphenol), 2.0 parts of MS-Magenta-VP and 1.6 parts of 2,4-diethylthioxanthone, respectively.

A cyan-image forming medium was produced in the same manner as the yellow-image forming medium except that 2.5 parts of 1-phenyl-1-(3,5-di-t-butyl-4-hydroxyphenyl)ethane, 2.0 parts of MS-Yellow-VP and 1.7 parts of benzyldimethylketal, used in the yellow-image forming medium, were replaced with 1.8 parts of 4,4-methylenebis(2-naphthol), 2.0 parts of MS-Cyan-VP and 2.7 parts of 3,3-carbonbis(7-diethylaminocumarine, respectively.

The three kinds of image forming mediums thus obtained were cut into A4-size sheets, and were put in the cartridge 14. These three kinds of image forming mediums were set therein in the manner that they were fed from the cartridge 14 in the order of yellow, magenta and cyan.

Thus, a multi-color image was formed on the image receiving medium in the same manner as in Example 1 except the following points:

In the present Example, a semiconductor laser with a wavelength of 780 nm and an output of 20 mW was used as the exposure means 20. Ultraviolet fluorescent lamps each having an emission peak at 390 nm were used as the exposure means 28. The removal of the PET film by means of the roller 6 was not carried out. The color transfer recording medium was not used, and an adhesive sheet was used in place of it. Using this adhesive sheet, the image forming medium on which the heat-diffusible coloring matter had been transferred at the transfer zone was adhered, and then wound up on the roller 33. The heating using the heating roller 31 was at a temperature of 120° C.

Using the respective image forming mediums for yellow, magenta and cyan, images were formed on the same image receiving medium. As a result, a doubling-free sharp multi-color image was obtained.

We claim:

1. A method of forming an image by a process comprising the steps of;
   (a) securing an image receiving medium onto a support member;
   (b) superposing onto said image receiving medium an image forming medium containing at least a photosensitive silver halide, an organic silver salt, a reducing agent, a polymerizable polymer precursor and a photopolymerization initiator, and in that state subjecting said image forming medium to imagewise exposure;
   (c) heating the image forming medium having been subjected to the step (b);
   (d) subjecting the image forming medium having been subjected to the step (c), to polymerization exposure to form a polymer image in the image forming medium; and
   (e) transferring a heat-diffusible coloring matter to said image receiving medium, corresponding with said polymer image.

2. The method according to claim 1, wherein said steps from step (b) to step (e) are repeated.

3. The method according to claim 1, wherein said support member is cylindrical and said image receiving medium is secured to the periphery of the cylindrical support member.

4. The method according to claim 1, wherein said image forming medium comprises a photosensitive layer containing at least the photosensitive silver halide, the organic silver salt and the reducing agent, and a polymerizing layer containing at least the polymerizable polymer precursor and the photopolymerization initiator.

5. The method according to claim 4, wherein the step of peeling said photosensitive layer from said polymerizing layer is provided after completion of said step (d) and before said step (e).

* * * * *

UNITED STATES PATENT AND TRADEMARK OFFICE
CERTIFICATE OF CORRECTION

PATENT NO. : 5,187,041  
DATED : February 16, 1993  
INVENTOR(S) : AKIHIRO MOURI, ET AL.

Page 1 of 5

It is certified that error appears in the above-identified patent and that said Letters Patent is hereby corrected as shown below:

COLUMN 1

Line 14, "electrons" should read --electron--.  
Line 17, "examples," should read --example,--.

COLUMN 3

Line 41, "shown" should read --show--.

COLUMN 5

Line 44, "(FIG. 3E)." should read --(FIG. 1E).--.

COLUMN 6

Line 16, "king" should read --kind--.  
Line 33, "tot he" should read --to the-- and "addition" should read --additional--.

COLUMN 7

Line 41, "unexposed" should read --exposed--.  
Line 42, "the polymerization" should read --the polymerization layer 112f (resulting in a higher degree of polymerization--.

COLUMN 8

Line 8, "carried" should read --carries--.  
Line 33, "brings" should read --bring--.  
Line 56, "obstacle" should read --obstruct--.

UNITED STATES PATENT AND TRADEMARK OFFICE
CERTIFICATE OF CORRECTION

PATENT NO. : 5,187,041
DATED : February 16, 1993
INVENTOR(S) : AKIHIRO MOURI, ET AL.

It is certified that error appears in the above-identified patent and that said Letters Patent is hereby corrected as shown below:

COLUMN 9

Line 6, "wing-up" should read --wind-up--.

COLUMN 10

Line 6, "react" should read --react with--.
Line 24, "colering" should read --coloring--.
Line 25, "the" should read --The--.
Line 29, "2,3'" should read --2,2'--.
Line 33, "mula:" should read --mulae:--.

COLUMN 11

Line 19, "12" should read --16--.

COLUMN 12

Line 6, "is" should read --is a--.
Line 52, "include," should read --includes,--.
Line 65, "substituent" should read --substituted--.

COLUMN 13

Line 30, "butyl," should read --butylphenol,--.
Line 48, "4(2" should read --4-(2--.

COLUMN 14

Line 4, "2,6di" should read --2,6-di--.

UNITED STATES PATENT AND TRADEMARK OFFICE
CERTIFICATE OF CORRECTION

PATENT NO. : 5,187,041

DATED : February 16, 1993

INVENTOR(S) : AKIHIRO MOURI, ET AL.

It is certified that error appears in the above-identified patent and that said Letters Patent is hereby corrected as shown below:

COLUMN 15

Line 1, "peiperidinoethyl," should read --piperidinoethyl,--.
Line 42, "cyclohexy" should read --cyclohexyl--.
Line 53, "4,(3'-" should read --4-(3'- --.
Line 55, "napthol," should read --naphthol-- and "hydroxynaphtyl" should read --hydroxynaphthyl--.
Line 59, "4,4'-benzylidenebis(2-methyl-1-" should be deleted.
Line 60, "naphthol)," (first occurrence) should be deleted.

COLUMN 16

Line 49, "dimethlaminomethyl," should read --dimethylaminomethyl,--.
Line 51, "pyperidinoethyl," should read --piperidinoethyl,--.
Line 54, "$R^8$, $R^8$," should read --$R^8$, $R^9$,--.

COLUMN 17

Line 6, "acetylamino, phenylamino," should read --acetylamino, methylamino, isopropylamino, dimethylamino, phenylamino,--.
Line 21, "4-tolylmethyl" should read --4-p-tolylmethyl--.
Line 34, "hydroxyphenyl)-methyl" should read --hydroxyphenyl)methyl--.
Line 65, "react" should read --reacted--.
Line 68, "includes," should read --include--.

COLUMN 18

Line 14, "thyl)3" should read --thyl)-3--.
Line 66, "thoxanthone" should read --thioxanthone--.

UNITED STATES PATENT AND TRADEMARK OFFICE
CERTIFICATE OF CORRECTION

PATENT NO. : 5,187,041
DATED : February 16, 1993
INVENTOR(S) : AKIHIRO MOURI, ET AL.

It is certified that error appears in the above-identified patent and that said Letters Patent is hereby corrected as shown below:

COLUMN 19

Line 8, "or" should read --of--.
Line 28, "The" should read --In the--.

COLUMN 20

Line 7, "group," should read --groups,--.
Line 12, "example;" should read --example:--.
Line 41, "(acryloxyethoxy)" should read --acryloyloxyethoxy)--.
Line 43, "benzene, 1,4-" should read --benzene, 1,4-bis(acryloyloxymethylethoxycarbamoyl)benzene, 1,4- --.
Line 54, "$\beta,62\ '$" should read --$\beta,\beta'$--.

COLUMN 21

Line 12, "ester" should read --esters--.
Line 35, "coterephthalate)," should read --co-terephthalate),--.
Line 37, "bonates)," should read --bonate),--.

COLUMN 22

Line 22, "incorporation," should read --incorporating,--.

COLUMN 23

Line 13, "received" should read --receiving--.

UNITED STATES PATENT AND TRADEMARK OFFICE
CERTIFICATE OF CORRECTION

PATENT NO. : 5,187,041

DATED : February 16, 1993

INVENTOR(S) : AKIHIRO MOURI, ET AL.

It is certified that error appears in the above-identified patent and that said Letters Patent is hereby corrected as shown below:

<u>COLUMN 24</u>

Line 6, "produce" should read --produced--.
   Line 24, "2 µm" should read --22 µm--.
   Line 41, "checked" should read --chucked--.

<u>COLUMN 25</u>

Line 33, "medium" should read --medium,--.

<u>COLUMN 26</u>

Line 60, "7-diethylaminocumarine," should read
         --7-diethylaminocumarin),--.

Signed and Sealed this

Twenty-second Day of March, 1994

Attest:

BRUCE LEHMAN

*Attesting Officer*    *Commissioner of Patents and Trademarks*